(12) United States Patent
Berman et al.

(10) Patent No.: US 12,094,544 B2
(45) Date of Patent: Sep. 17, 2024

(54) PROGRAMMING BY SELF ADJUSTING PROGRAM VOLTAGE TARGETS COMPENSATING FOR CELL-TO-CELL INTERFERENCE AND PE CYCLES

(71) Applicant: SAMSUNG ELECTRONICS CO., LTD., Suwon-si (KR)

(72) Inventors: Amit Berman, Tel-Aviv (IL); Gari Fuks, Tel-Aviv (IL); Evgeny Blaichman, Tel-Aviv (IL)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 89 days.

(21) Appl. No.: 17/697,414

(22) Filed: Mar. 17, 2022

(65) Prior Publication Data

US 2023/0298674 A1 Sep. 21, 2023

(51) Int. Cl.
| | |
|---|---|
| *G11C 16/34* | (2006.01) |
| *G06N 3/065* | (2023.01) |
| *G11C 16/04* | (2006.01) |
| *G11C 16/10* | (2006.01) |

(52) U.S. Cl.
CPC ......... *G11C 16/3404* (2013.01); *G06N 3/065* (2023.01); *G11C 16/0483* (2013.01); *G11C 16/10* (2013.01); *G11C 16/3427* (2013.01)

(58) Field of Classification Search
CPC . G11C 16/3404; G11C 16/0483; G11C 16/10; G11C 16/3427; G11C 2211/563; G11C 11/5642; G11C 16/3418; G06N 3/065
USPC .......................................................... 711/103
See application file for complete search history.

(56) References Cited

U.S. PATENT DOCUMENTS

| | | | |
|---|---|---|---|
| 11,574,698 B1* | 2/2023 | Karakulak | G11C 11/54 |
| 2013/0010542 A1* | 1/2013 | Sarin | G11C 16/3418 |
| | | | 365/185.24 |
| 2014/0289584 A1* | 9/2014 | Chilappagari | G06F 11/1068 |
| | | | 714/755 |
| 2014/0334228 A1* | 11/2014 | Kim | G06F 11/1072 |
| | | | 365/185.03 |
| 2017/0004039 A1* | 1/2017 | Maffeis | G11C 29/52 |
| 2020/0293114 A1* | 9/2020 | Bean | G06F 3/04883 |
| 2022/0029640 A1* | 1/2022 | Eisenhuth | G06F 3/0679 |
| 2023/0127404 A1* | 4/2023 | Chen | G11C 16/26 |
| | | | 711/103 |

* cited by examiner

*Primary Examiner* — Hashem Farrokh
(74) *Attorney, Agent, or Firm* — Sughrue Mion, PLLC

(57) ABSTRACT

An storage device is provided. The storage device includes: a nonvolatile memory; and at least one processor configured to: obtain an input symbol to be stored in a target memory cell among a plurality of memory cells of the nonvolatile memory; obtain cell features of the plurality of memory cells; determine a target voltage for the target memory cell based on the input symbol and the cell features of the plurality of memory cells; and provide the target voltage to the target memory cell.

20 Claims, 11 Drawing Sheets

PROGRAMMING BY SELF ADJUSTING PROGRAM VOLTAGE TARGETS COMPENSATING FOR CELL-TO-CELL INTERFERENCE AND PE CYCLES

BACKGROUND

1. Field

Embodiments of the disclosure relate to an apparatus and a method of dynamically adjusting programming target voltages based on information about neighboring memory cells.

2. Description of Related Art

A flash memory device, such as a NAND flash memory device, is a nonvolatile memory that may retain stored data even when power supply is interrupted. Recently, a storage device including a flash memory, such as a solid state drive (SSD) and a memory, card has been widely used. The flash memory stores data by changing threshold voltages of memory cells, and reads data using a predetermined read level.

Program-erase (PE) cycles serve as a criterion for indicating the endurance of a NAND flash memory device. Generally, NAND memory devices have a finite number of PE cycles. That is, as data is written into and erased from a memory cell, each cycle causes a small amount of physical damage to the memory cell. Such physical damage may accumulate over time and change the threshold voltages of memory cells, thereby rendering the memory cell inoperable.

There has been ongoing research to improve pulse programming techniques for programming target voltages for NAND memory cells. In a related pulse programming technique, static target voltages are used, and changing characteristics of NAND memory cells and cell-to-cell interference are not accounted for. For example, the same pulse programming is used for all the NAND memory cells storing the same symbol, and does not consider characteristics of the NAND memory cells that change over their lifespan. Therefore, there is a need to improve pulse programming technique in order to account for changing characteristics of the NAND memory cells and to prevent cell-to-cell interference.

SUMMARY

The present disclosure relates to using one or more neural networks to determine programming target voltages for each memory cell based on information about neighboring memory cells.

According to an embodiment, there is provided an auto-modulation method. The method includes: obtaining an input symbol to be stored in a target memory cell among a plurality of memory cells; obtaining cell features of the plurality of memory cells; determining a target voltage for the target memory cell based on the input symbol and the cell features of the plurality of memory cells; and providing the target voltage to the target memory cell.

The auto-modulation method may include: reading the target voltage from the target memory cell; and determining an output symbol based on the target voltage.

The auto-modulation method may include: obtaining the cell features of the plurality of memory cells; and determining the output symbol based on the target voltage and the cell features of the plurality of memory cells.

The determining the target voltage may include controlling a first neural network to determine the target voltage.

The determining the output symbol may include controlling a second neural network to determine the output symbol.

The auto-modulation method may include: implementing a simulator configured to simulate the plurality of memory cells; providing input symbols and the cell features of the plurality of memory cells to the simulator; obtaining output symbols from the simulator; determining a loss function based on the input symbols, the cell features of the plurality of memory cells and the output symbols; and updating the first neural network and the second neural network based on the loss function.

The plurality of memory cells may include at least one neighboring memory cell directly adjacent the target memory cell.

The plurality of memory cells may be arranged three-dimensionally, the plurality of memory cells may include a first neighboring memory cell adjacent the target memory cell in a first direction, a second neighboring memory cell adjacent the target memory cell in a second direction, and a third neighboring memory cell adjacent the target memory cell in a third direction, and the first direction, the second direction and the third direction may intersect each other.

The determining the target voltage of the target memory cell may include: obtaining a high precision pulse signal of the target voltage from the first neural network; and converting the high precision pulse signal of the target voltage into a discrete signal.

The cell features of the plurality of memory cells may include any one or any combination of a response time of a memory cell in response to programming pulses and information about properties of the memory cell.

The plurality of memory cells may be grouped into a plurality of groups, each of which is programmed to a group target voltage assigned to that group.

The obtaining the output symbol may include: receiving a voltage readout of at least one neighboring memory cell adjacent to the target memory cell in the plurality of memory cells; demodulating the voltage readout and the target voltage read from the target memory cell to obtain a probability distribution over possible symbols; and determining a maximum probability in the probability distribution to obtain the output symbol.

The plurality of memory cells may be NAND memory cells.

Each of the plurality of memory cells may be a triple-level cell (TLC) configured to store a symbol indicating three bits.

The plurality of memory cells may include a first memory cell and a second memory cell, the first memory cell may store a first symbol at a first target voltage, and the second memory cell may store the first symbol at a second target voltage different from the first target voltage.

The plurality of memory cells may include a first memory cell and a second memory cell, the first memory cell may store a first symbol at a first target voltage, and the second memory cell may store a second symbol at the first target voltage.

According to an embodiment, there is provided a storage device including: a nonvolatile memory; and at least one processor configured to: obtain an input symbol to be stored in a target memory cell among a plurality of memory cells of the nonvolatile memory; obtain cell features of the plurality of memory cells; determine a target voltage for the target memory cell based on the input symbol and the cell features of the plurality of memory cells; and provide the target voltage to the target memory cell.

The at least one processor may be further configured to: read the target voltage from the target memory cell; and determine an output symbol based on the target voltage.

The at least one processor may be further configured to: obtain the cell features of the plurality of memory cells; and determine the output symbol based on the target voltage and the cell features of the plurality of memory cells.

The at least one processor may be further configured to control a first neural network to determine the target voltage.

The at least one processor may be further configured to control a second neural network to determine the output symbol.

The storage device may further include at least one second processor configured to: provide input symbols and the cell features of the plurality of memory cells to a simulator configured to simulate the plurality of memory cells; obtain output symbols from the simulator; determine a loss function based on the input symbols, the cell features of the plurality of memory cells and the output symbols; and update the first neural network and the second neural network based on the loss function.

The plurality of memory cells may include at least one neighboring memory cell directly adjacent the target memory cell.

The plurality of memory cells may be arranged three-dimensionally, the plurality of memory cells may include a first neighboring memory cell adjacent the target memory cell in a first direction, a second neighboring memory cell adjacent the target memory cell in a second direction, and a third neighboring memory cell adjacent the target memory cell in a third direction, and the first direction, the second direction and the third direction may intersect each other.

The at least one processor may be further configured to: obtain a high precision pulse signal of the target voltage from the first neural network; and convert the high precision pulse signal of the target voltage into a discrete signal.

The cell features of the plurality of memory cells may include any one or any combination of a response time of a memory cell in response to programming pulses and information about properties of the memory cell.

The plurality of memory cells may be grouped into a plurality of groups, each of which is programmed to a group target voltage assigned to that group.

The at least one processor may be further configured to: receive a voltage readout of at least one neighboring memory cell adjacent to the target memory cell in the plurality of memory cells; demodulate the voltage readout and the target voltage read from the target memory cell to obtain a probability distribution over possible symbols; and determine a maximum probability in the probability distribution to obtain the output symbol.

Each of the plurality of memory cells may be a triple-level cell (TLC) configured to store a symbol indicating three bits.

The plurality of memory cells may include a first memory cell and a second memory cell, the first memory cell may be configured to store a first symbol at a first target voltage, and the second memory cell may be configured to store the first symbol at a second target voltage different from the first target voltage.

The plurality of memory cells may include a first memory cell and a second memory cell, the first memory cell may be configured to store a first symbol at a first target voltage, and the second memory cell may be configured to store a second symbol at the first target voltage.

According to an embodiment, there is provided a non-transitory computer-readable recording medium having a computer program recorded thereon, the computer program, when executed by at least one processor, is configured to: obtain an input symbol to be stored in a target memory cell among a plurality of memory cells of the nonvolatile memory; obtain cell features of the plurality of memory cells; determine a target voltage for the target memory cell based on the input symbol and the cell features of the plurality of memory cells; and provide the target voltage to the target memory cell.

BRIEF DESCRIPTION OF THE DRAWINGS

The above and other aspects will be more apparent from the following description taken in conjunction with the accompanying drawings in which.

DETAILED DESCRIPTION

Figure 1:
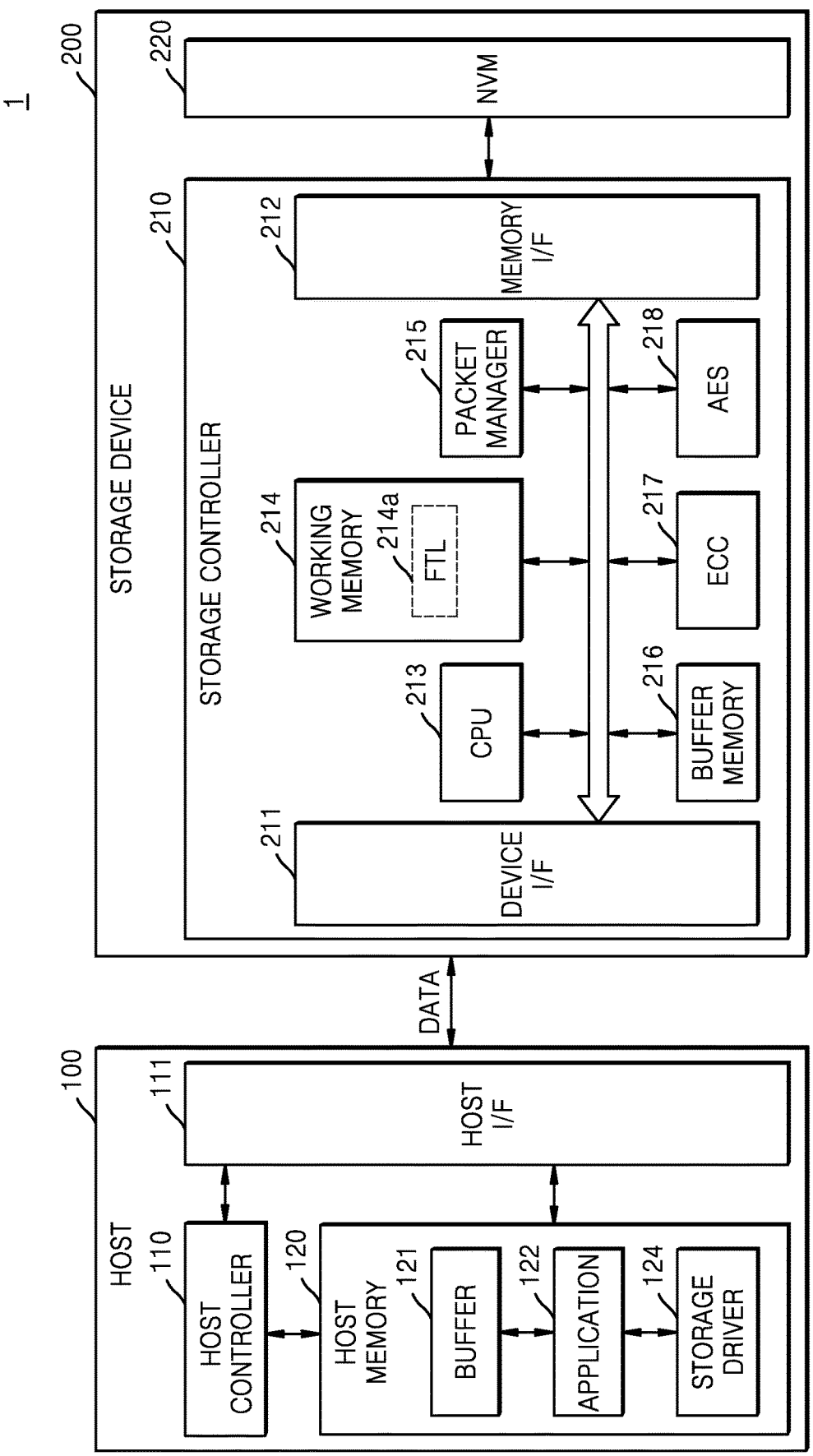
FIG. 1 is a block diagram illustrating a storage system according to embodiments.

Hereinafter, one or more embodiments of the disclosure will be described in detail with reference to the accompanying drawings.

The embodiments described herein are all example embodiments, and thus, the inventive concept is not limited thereto, and may be realized in various other forms. Each of the embodiments provided in the following description is not excluded from being associated with one or more features of another example or another embodiment also provided herein or not provided herein but consistent with the inventive concept. For example, even if matters described in a specific example or embodiment are not described in a different example or embodiment thereto, the matters may be understood as being related to or combined with the different example or embodiment, unless otherwise mentioned in descriptions thereof. In addition, it should be understood that all descriptions of principles, aspects, examples, and embodiments of the inventive concept are intended to encompass structural and functional equivalents thereof. In addition, these equivalents should be understood as including not only currently well-known equivalents, but also equivalents to be developed in the future, that is, all devices invented to perform the same functions regardless of the structures thereof.

As used herein, expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c. Herein, when a term "same" is used to compare a dimension of two or more elements, the term may cover a "substantially same" dimension.

It will be understood that, although the terms first, second, third, fourth etc. may be used herein to describe various elements, these elements should not be limited by these terms. These terms are only used to distinguish one element from another element. Thus, a first element discussed below could be termed a second element without departing from the teachings of the inventive concept.

It will be also understood that, even if a certain step or operation is described later than another step or operation, the step or operation may be performed later than the other step or operation unless the other step or operation is specifically described as being performed after the step or operation.

One or more embodiments are described herein with reference to cross-sectional illustrations that are schematic illustrations. As such, variations from the shapes of the illustrations as a result, for example, of manufacturing techniques and/or tolerances, are to be expected. Thus, embodiments should not be construed as being limited to a particular shape as illustrated in the accompanying drawings, but it should be understood that embodiments may include various shapes that deviate from the accompanying drawings. For example, embodiments illustrated in the drawings are schematic in nature and their shapes are not intended to illustrate the actual shape of a device or an apparatus, and are not intended to limit the scope of the present inventive concept. Further, in the drawings, the sizes and relative sizes of layers and regions may be exaggerated for clarity.

For the sake of brevity, conventional elements to semiconductor devices may or may not be described in detail herein. However, even if a certain element is described or illustrated in a semiconductor device in this disclosure, the element may not be included in a claimed semiconductor device unless the element is recited as being included in the claimed semiconductor device.

FIG. 1 is a block diagram illustrating a storage system according to embodiments.

Referring to FIG. 1, a storage system 1 according to embodiments may include host 100 and storage device 200.

The storage device 200 may include storage media for storing data according to a request from the host 100. As one example, the storage device 200 may include any one or any combination of a solid state drive (SSD), an embedded memory, or a removable external memory. When the SSD is provided in the storage device 200, the storage device 200 may be a device conforming to a standard such as nonvolatile memory express (NVMe), Serial ATA (SATA), or Serial Attached SCSI (SAS). When the embedded memory or the external memory is provided in the storage device 200, the storage device 200 may be a device conforming to a standard such as universal flash storage (UFS), embedded multi-media card (eMMC), security digital (SD), or other protocol. The host 100 and the storage device 200 may each generate and transmit a packet according to an adopted standard protocol.

A nonvolatile memory 220 of the storage device 200 may include a flash memory. For example, the flash memory may include a 2D NAND memory array or a 3D (or vertical) NAND (VNAND) memory array.

The storage device 200 may include a storage controller 210 and the nonvolatile memory 220.

The storage controller 210 may include the device interface 211, a memory interface 212, and a central processing unit (CPU) 213. In addition, the storage controller 210 may further include the working memory 214, a packet manager 215, a buffer memory 216, an error correction code (ECC) engine 217, and an advanced encryption standard (AES) engine 218.

The device interface 211 may transmit a packet to the host 100 and receive a packet from the host 100. A packet transmitted from the host 100 to the device interface 211 may include a command, data to be written to the nonvolatile memory 220, and the like. A packet transmitted from the device interface 211 to the host 100 may include a response to the command, data read from the nonvolatile memory 220, and the like. The memory interface 212 may transmit data to be written to the nonvolatile memory 220 to the nonvolatile memory 220 or may receive data read from the nonvolatile memory 220. The memory interface 212 may be implemented to conform to standard conventions such as Toggle or ONFI.

The working memory 214 may operate under the control of the CPU 213 and may be used as a working memory, a buffer memory, a cache memory, or the like. For example, the working memory 214 may be implemented as a volatile memory such as DRAM or SRAM, or a nonvolatile memory such as PRAM or flash memory.

A flash transition layer (FTL) 214a may be loaded into the working memory 214. Data write and read operations for the nonvolatile memory 220 may be controlled by the CPU 213 executing the flash transition layer 214a. The flash transition layer 214a may perform various functions such as address mapping, wear-leveling, and garbage collection. The address mapping operation is an operation of converting a logical address received from the host into a physical address used to actually store data in the nonvolatile memory 220. The wear-leveling function is a technique for preventing excessive deterioration of a specific block by allowing blocks in the nonvolatile memory 220 to be uniformly used. For example, the wear-leveling may be implemented through firmware technology that balances erase counts of physical blocks. The garbage collection function is a technique for securing usable capacity in the nonvolatile memory 220 by copying valid data of a block to a new block and erasing the existing block.

The packet manager 215 may generate a packet according to a protocol of an interface negotiated with the host 100 or may parse various types of information from a packet received from the host 100. In addition, the buffer memory 216 may temporarily store data to be written to the nonvolatile memory 220 or data read from the nonvolatile memory 220. The buffer memory 216 may be provided inside the storage controller 210, or alternatively, may be provided outside the storage controller 210.

The ECC engine 217 may perform an error detection and correction function for read data read from the nonvolatile memory 220. More specifically, the ECC engine 217 may generate parity bits for write data to be written to the nonvolatile memory 220, and the generated parity bits may be stored in the nonvolatile memory 220 together with the write data. When data is read from the nonvolatile memory 220, the ECC engine 217 may correct an error in the read data using parity bits read from the nonvolatile memory 220 together with the read data, and may output the read data in which the error has been corrected.

The AES engine 218 may perform, using a symmetric-key algorithm, any one or any combination of an encryption operation or a decryption operation for data inputted to the storage controller 210.

According to embodiments, the host 100 may include host controller 110, host memory 120, and host interface 111.

According to an embodiment, the host controller 110 and the host memory 120 may be implemented as separate semiconductor chips. Alternatively, in embodiments, the host controller 110 and the host memory 120 may be integrated in the same semiconductor chip. As one example, the host controller 110 may be any one of a plurality of modules provided in an application processor, and the application processor may be implemented as a system on chip (SoC). In addition, the host memory 120 may be an embedded memory provided in the application processor, or a nonvolatile memory or a memory module disposed outside the application processor.

The host controller 110 may have an operating system (OS) installed, and may control the overall operation of the host 100 by the operating system (OS). The operating system (OS) may be, for example, any one of Windows series, Unix series, Linux series, and the like. The host controller 110 may manage an operation of storing data (e.g., write data) of a buffer area 121 into the nonvolatile memory 220 or storing data (e.g., read data) of the nonvolatile memory 220 into the buffer area 121.

The host interface 111 may provide a physical connection between the host 100 and the storage device 200. The host interface 111 may be implemented with various types of interfaces, such as advanced technology attachment (ATA), SATA, external SATA (e-SATA), small computer small interface (SCSI), SAS, peripheral component interconnection (PCI), PCI express (PCIe), IEEE 1394, universal serial bus (USB), secure digital (SD) card, multi-media card (MMC), embedded multi-media card (eMMC), and compact flash (CF) card.

The host memory 120 may be used as a buffer memory, a working memory, or the like for temporarily storing data to be transmitted to the storage device 200 or data transmitted from the storage device 200. For example, the host memory 120 may be implemented as a volatile memory such as DRAM or SRAM, or a nonvolatile memory such as PRAM or flash memory.

An application 122 and a storage driver 124 may be implemented in firmware or software, and may be loaded into the host memory 120. Alternatively, the application 122 and/or the storage driver 124 may be implemented in hardware.

The application 122 may correspond to various types of applications installed on the host 100 and capable of accessing the storage device 200.

The storage driver 124 may access the storage device 200 at the request of the operating system or the application 122. The storage driver 124 may convert the request of the application 122 into a command corresponding to the storage device 200 to access the storage device 200.

Figure 2:
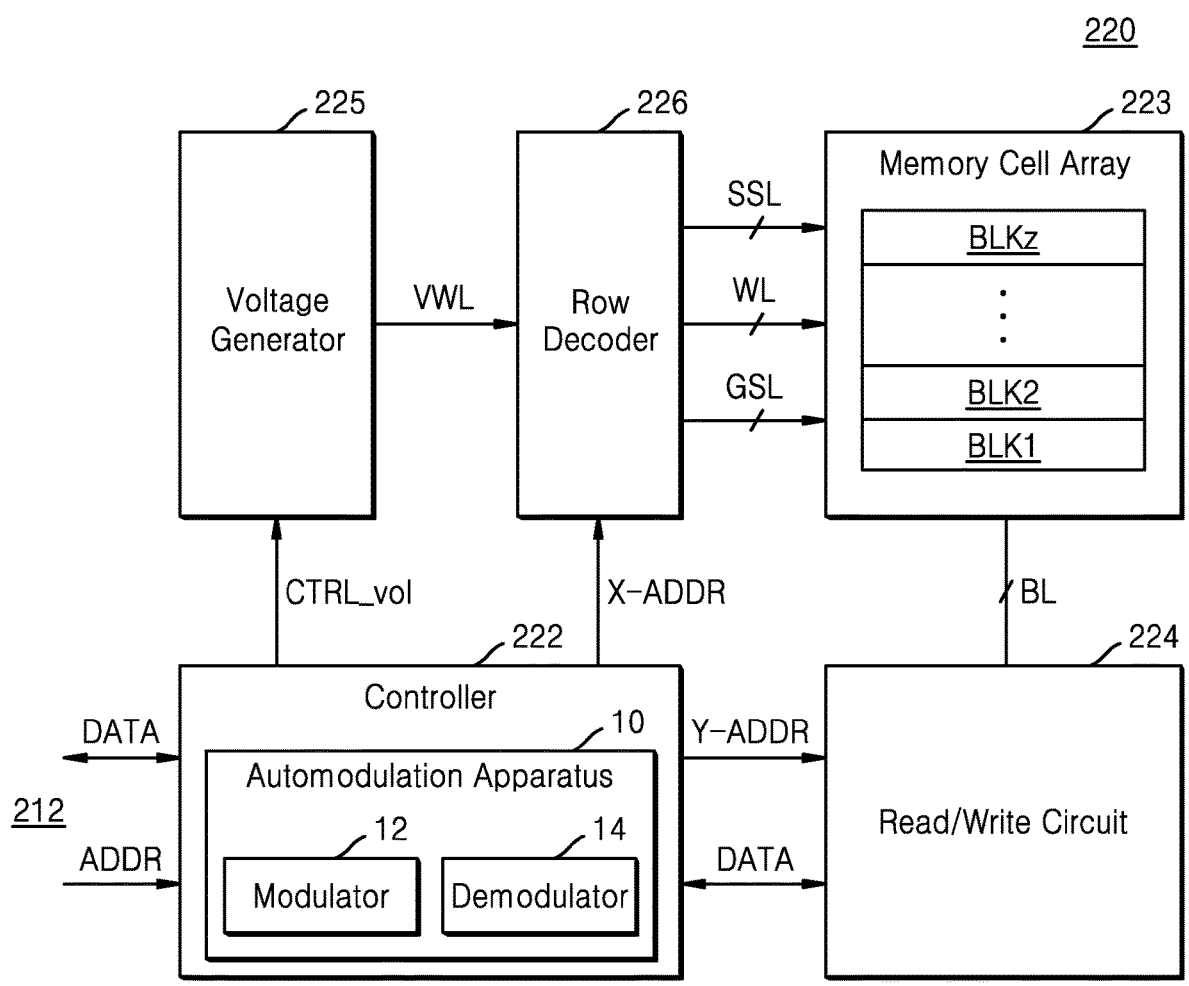
FIG. 2 is a block diagram illustrating a nonvolatile memory according to embodiments.

FIG. 2 is a block diagram illustrating a nonvolatile memory according to embodiments.

Referring to FIG. 2, the nonvolatile memory 220 may include a controller 222, a memory cell array 223, a read/write circuit 224, a voltage generator 225, and a row decoder 226. The nonvolatile memory 220 may further include the memory interface 212 shown in FIG. 1, and may further include a column logic, a pre-decoder, a temperature sensor, a command decoder, an address decoder, and the like.

The controller 222 may control various operations of the nonvolatile memory 220. The controller 222 may output various control signals in response to a command CMD and/or an address ADDR from the memory interface 212. For example, the controller 222 may output a voltage control signal CTRL_vol, a row address X-ADDR, and a column address Y-ADDR.

The controller 222 may include an auto-modulation apparatus 10 which includes a modulator 12 and a demodulator 14.

The modulator 12 may identify target voltages for storing data in memory cells based on cell features and input symbols of one or more memory cells among a plurality of memory cells. The modulator 12 may obtain cell features of a plurality of memory cells included in a memory device. For example, each memory cell may store a symbol indicating data stored therein. For example, the cell features may include symbols of neighboring memory cells of a target memory cell, among the plurality of memory cells. As will be described in more detail below with reference to FIG. 5, neighboring memory cells may be located adjacent to a target memory cell. For example, in a case where memory cells are arranged three-dimensionally, neighboring memory cells may be disposed adjacent to a target cell in any coordinate direction (e.g., x, y, z directions). The cell features may also indicate a response time of a memory cell, a capacity of a memory cell, a reference voltage of a memory cell, etc. For example, a reference voltage may be a voltage previously programmed for a memory cell and/or may be an average voltage of voltages previously programmed for a group of memory cells (e.g., memory cells included in a wordline (WL)). Although the modulator 12 is described as being provided within the controller 222, embodiments are not limited thereto. For example, some or all of the modulator 12 may be implemented by the storage controller 210 or the host 100.

The demodulator 14 may identify symbols corresponding to data stored in memory cells based on cell features and read voltages of one or more memory cells among a plurality of memory cells. The demodulator 14 may obtain cell features of a plurality of memory cells included in a memory device. Although the demodulator 14 is described as being provided within the controller 222, embodiments are not limited thereto. For example, some or all of the demodulator 14 may be implemented by the storage controller 210 or the host 100.

The memory cell array 223 may include a plurality of memory blocks BLK1 to BLK2 (z is a positive integer), and each of the plurality of memory blocks BLK1 to BLKz may include a plurality of memory cells. The memory cell array 223 may be connected to the read/write circuit 224 through bit lines BL, and may be connected to the row decoder 226 through word lines WL, string select lines SSL, and ground select lines GSL.

In an embodiment, the memory cell array 223 may include memory cells. Each of the memory cells may store data. For example, the memory cells may be single-level cells (SLC) which store one bit of information per cell, multi-level cells (MLC) which store multiple bits per cell (i.e., two bits per cell), or a triple-level cell (TLC) which stores three bits per cell. For example, each of the cells may store a symbol representative of the bits stored in each cell. For example, an SLC may be configured to store a first symbol representing 0 or a second symbol representing 1. For example, an MLC may be configured to store a first symbol representing 00, a second symbol representing 01, a third symbol representing 10, or a fourth symbol representing 11. For example, a TLC may be configured to store a first symbol representing 000, a second symbol representing 001, a third symbol representing 010, a fourth symbol representing 011, a fifth symbol representing 100, a sixth symbol representing 101, a seventh symbol representing 110, or an eighth symbol representing 111. For example, the symbols may be represented by a voltage level. In this regard, the SLC may store two different voltage levels, the MLC may store four different voltage levels, and the TLC may store eight different voltage levels.

In an embodiment, the memory cell array 223 may be a 3D memory cell array, and the 3D memory cell array may include a plurality of NAND strings. Each NAND string may include memory cells respectively connected to word lines vertically stacked on a substrate.

In an embodiment, the memory cell array 223 may include a 2D memory cell array, and the 2D memory cell array may include a plurality of NAND strings arranged along row and column directions.

The read/write circuit 224 may be connected to the memory cells through the plurality of bit lines BL. The read/write circuit 224 may select at least one of the bit lines BL based on the column address Y-ADDR. The read/write circuit 224 may operate as a write driver or a sense amplifier depending on an operation mode.

For example, during a program operation, the read/write circuit 224 may operate in a write operation mode and apply, to the selected bit line, a target voltage corresponding to data to be programmed. The modulator 12 may determine the target voltage based on an input symbol, cell features and symbols of neighboring memory cells, and output the target voltages to the memory cell array 223.

During a read operation, the read/write circuit 224 may operate in a read operation mode and sense data stored in the memory cell by sensing a current or voltage of the selected bit line. The demodulator 14 may receive voltage readouts for the plurality of memory cells from the memory cell array, demodulate the voltage readouts and output a probability distribution over the possible set of symbols. Here, the voltage readouts of the memory cells may include voltage readouts of the target memory cell, as well as the neighboring memory cells to the target memory cell. Based on the voltage readouts of the plurality of memory cells, the demodulator 14 determines the probability distribution of input symbols of the plurality of memory cells and outputs symbols having a maximum probability.

The voltage generator 225 may generate various types of voltages for performing program, read, and erase operations based on the voltage control signal CTRL_vol. For example, the voltage generator 225 may generate a program voltage, a read voltage, a program verification voltage, an erase voltage, and the like as a word line voltage VWL.

The row decoder 226 may select one of the plurality of word lines WL and one of the plurality of string select lines SSL, based on the row address X-ADDR. For example, during a program operation, the row decoder 226 may apply a program voltage and a program verification voltage to the selected word line, and during a read operation, the row decoder 226 may apply a read voltage to the selected word line.

Figure 3:
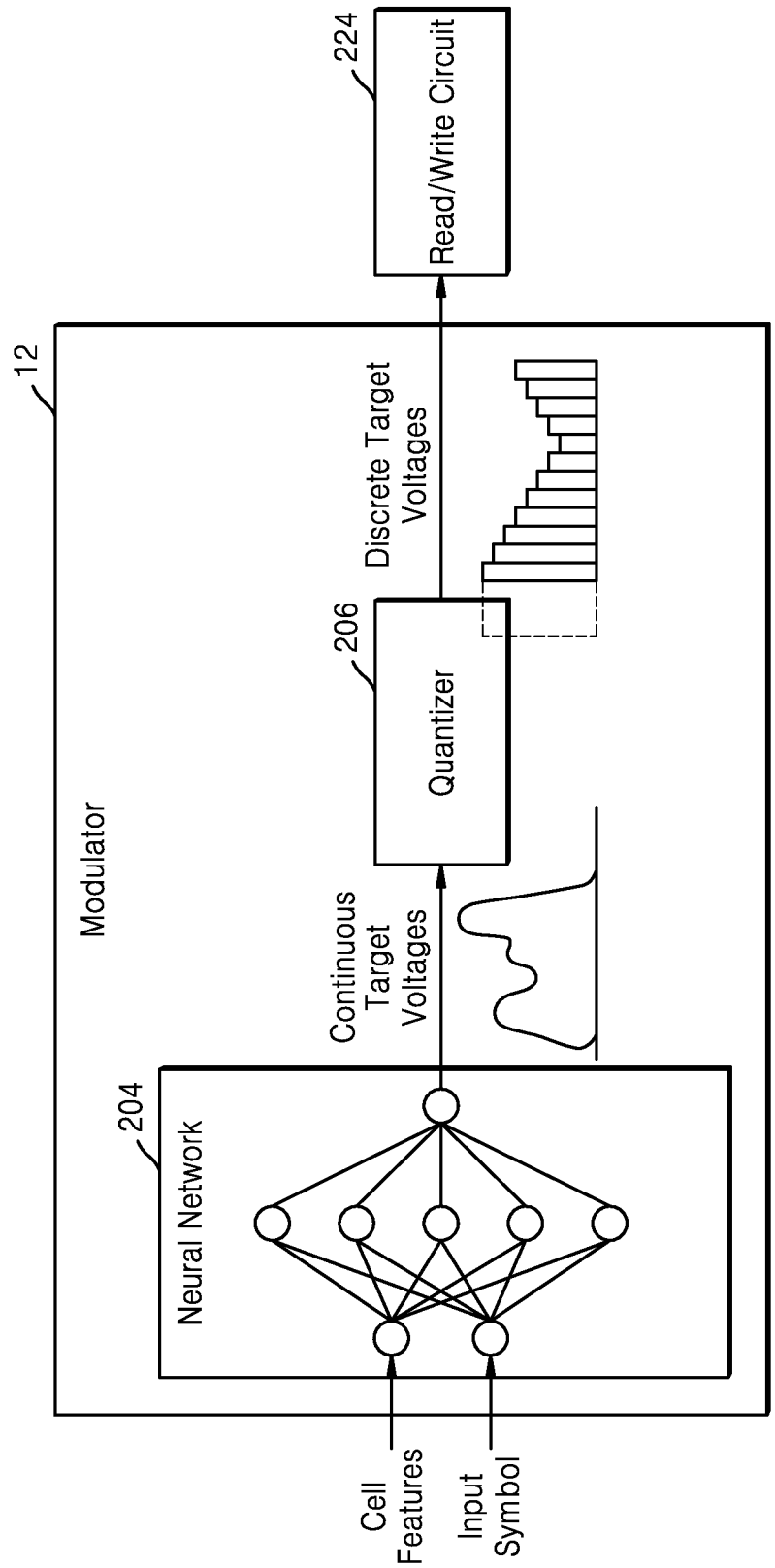
FIG. 3 is a diagram illustrating a modulator according to embodiments.

FIG. 3 is a diagram illustrating a modulator according to an embodiment.

Referring to FIG. 3, the modulator 12 may include a neural network 204 including a plurality of layers. For example, the plurality of layers may include an input layer, a hidden layer and an output layer. The input layer may receive information about cell features and input symbols of one or more memory cells among a plurality of memory cells. The hidden layer may include a plurality of nodes associated with certain weight values, and the weight values may be updated according to the loss function determined by the cross-entropy unit 18 (shown in FIG. 8). The output layer may output a target voltage of a memory cell based on the information about cell features and input symbols. Here, the target voltage may be output as a high precision pulse signal.

As discussed above, the modulator 12 may obtain cell features of a plurality of memory cells included in a memory device. As described above, characteristics of each of the memory cells may change over time depending on the number of read and write operations performed on each of the memory cells. Also, a programming interference phenomenon may occur between the memory cells. That is, when a memory cell is programmed to a certain value, the programming operation of the memory cell affects not only the programmed memory cell, but also the threshold voltages of the neighboring memory cells, which may lead to storing inaccurate values in the memory cell and the neighboring memory cells. Accordingly, the modulator 12 dynamically adjusts the programming target voltage for each of the plurality of memory cells to account for cell features that changes over time due to PE cycles, interferences caused by the neighboring memory cells, and adopt the correction for the wordline (WL) characteristics. In adopting the correction for the wordline (WL) characteristics, the modulator 12 implicitly adopts the programming target voltages for different blocks and chips.

The modulator 12 may also include a quantizer 206 that converts the high precision pulse signal of the target voltage into a discrete signal, and outputs the discrete target voltage to the read/write circuit 224.

For example, a single symbol (i.e., the same symbol) may be programmed to different memory cells using different target voltages. For example, two cells storing different information symbols may have the same programming target voltage. For example, these features may provide more accurate programming by pre-compensating for NAND distortion such that the modulation cancels out with the disturbances resulting in accurate threshold voltages.

In contrast to the related pulse programming technique in which the number of target voltages is the same as the number of symbols, the number of discrete target voltages used by modulator 12 according to embodiments is significantly larger than the number of symbols. Due to the increased number of target voltages, distances between the target voltages are smaller than in the related pulse programming technique. Close target voltages may be programmed without increasing the number of programming pulses, utilizing only additional verify operations. Verify operation for close threshold voltages may be performed without significantly increasing the latency by only changing the sensing time.

A solid-state device (SSD) typically works at maximal read throughput when the hard decision (HD) mode of operation is exclusively used. While the soft decision (SD) mode of operation provides accurate decisions, the SD mode of operation significantly increases the number of read voltage operations, thereby increasing the time required for the operation and degrading the throughput. The auto-modulation apparatus 10 according to an embodiment may allow maximal read throughput, thereby enabling a higher number of P/E cycles and a higher hard decision operation data HDTR throughput.

Figure 4:
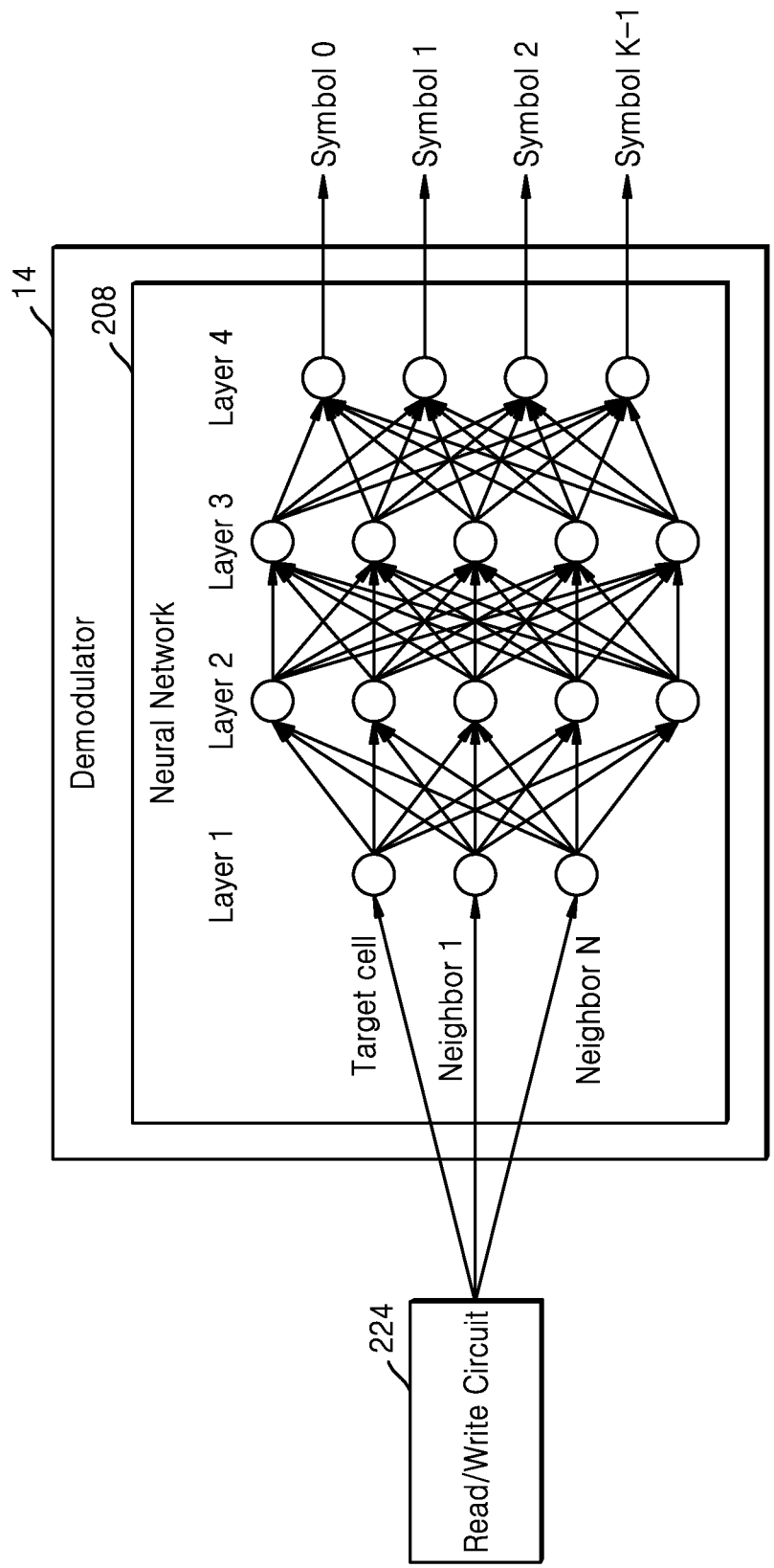
FIG. 4 is a diagram illustrating a demodulator according to embodiments.

FIG. 4 is a diagram illustrating a demodulator according to an embodiment.

Referring to FIG. 4, the demodulator 14 may include a neural network 208 having a plurality of layers (e.g., Layers 1 to 4). Although the neural network 208 is illustrated as having four layers in FIG. 4, embodiments are not limited thereto, and the neural network 208 of the demodulator 14 may include more than four layers or fewer than four layers. The demodulator 14 may receive voltage readouts of a target memory cell and provide the voltage readouts to the neural network 208. For example, the Layer 1 of the neural network 208 may receive the voltage readout of the target memory cell and N neighboring memory cells. The neural network 208 demodulates the voltage readout to output a probability distribution of the possible set of symbols. Based on the voltage readout of the memory cells, the neural network 208 determines the probability distribution of the symbols stored in the memory cell and outputs symbols 0 to K−1 having a maximum probability.

The demodulator 14 may also receive voltage readouts for the plurality of memory cells from the read/write circuit 224, as well as cell features of neighboring cells and wordline features. The demodulator 14 may demodulate the voltage readouts, cell features and wordline features and output a probability distribution over the possible set of symbols. Here, the voltage readouts of the memory cells may include voltage readouts of the neighboring memory cells to the target memory cell. Based on the voltage readouts of the plurality of memory cells, the demodulator 14 determines the probability distribution of the set of symbols for the target memory cell and outputs a symbol having a maximum probability.

The neural network of the demodulator 14 may output a symbol that is optimized to improve the performance of the memory cells in both hard decision (HD) and soft decision (SD) modes of operations. In a hard decision (HD) operation, a predetermined threshold voltage may be used to determine a symbol stored in the memory cells. For example, assume that a symbol including bits "01" is stored in a memory cell. A predetermined threshold voltage may be set to 0.5 V, and the cell voltage may be sampled at certain time points to determine whether the cell voltage is greater than or equal to the predetermined threshold voltage. In this example, if the cell voltage at a given time point is greater than or equal to the predetermined threshold voltage of 0.5 V, then a bit of the symbol is determined as "1". However, if the cell voltage at each time point is less than the predetermined threshold of 0.5 V, then a bit of the symbol is determined as "0". In the hard decision (HD) operation, if the pulse signal does not rise to 0.5 V at a given sampling time point, even the stored bit is "1", the bit may be determined as "0" and may lead to an error. In a soft decision (SD) operation, a symbol may be compared with all possible symbols, and a minimum Euclidean distance may be calculated to determine the symbol stored in a memory cell. For example, in SD operation, Euclidean distances may be calculated for all the symbols "00", "01", "10" and "11", and the minimum Euclidean distance may be select to determine the stored symbol.

Figure 5:
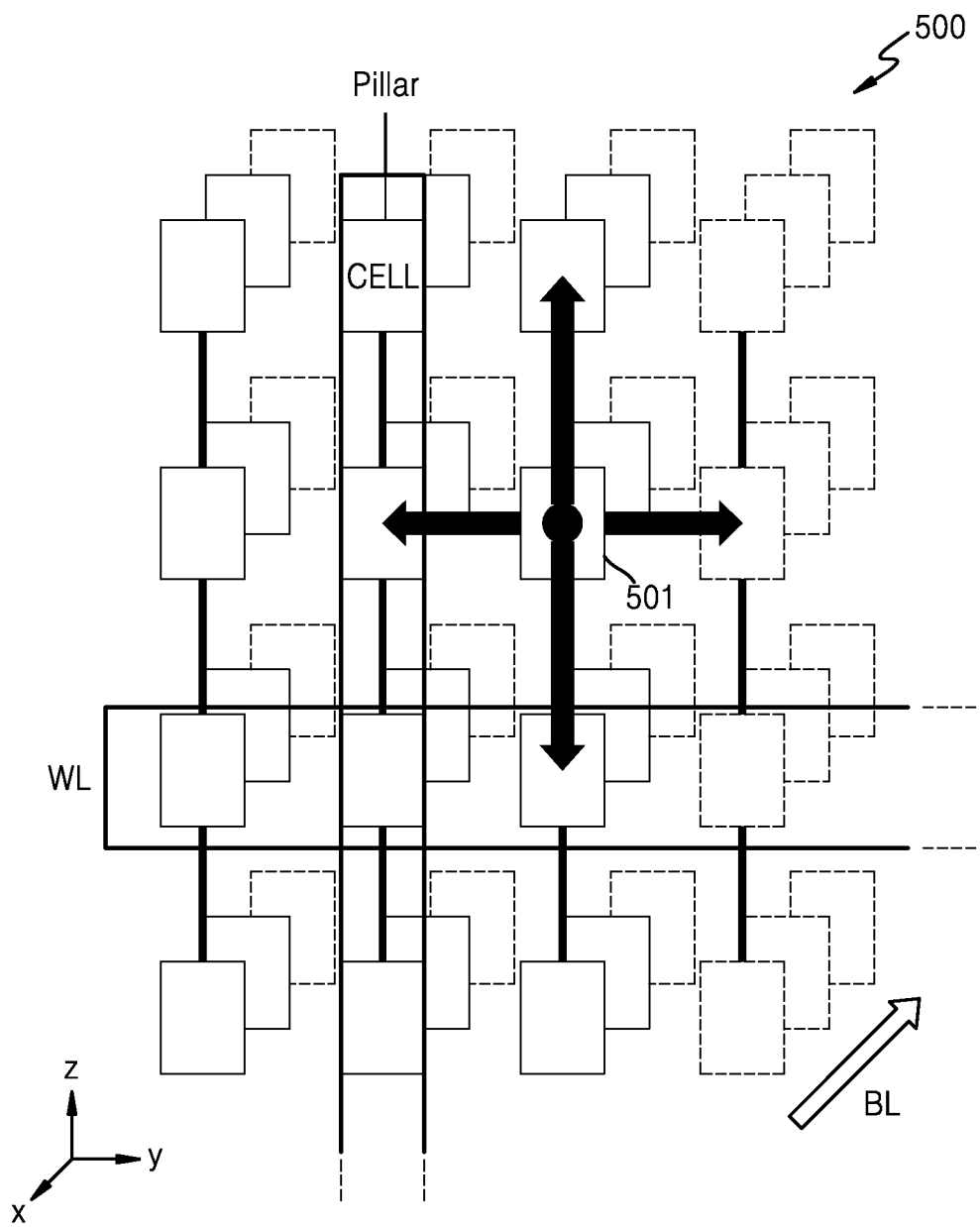
FIG. 5 is a diagram illustrating a NAND structure of a memory according to embodiments.

FIG. 5 is a diagram illustrating a NAND structure of a memory according to an embodiment.

Referring to FIG. 5, the NAND structure 500 may include a plurality of memory cells. Here, the NAND structure 500 may be a three-dimensional (3D) structure of memory cells. That is, the plurality of memory cells may be disposed such that the plurality of memory cells extend in each of the x, y, and z directions. Here, the NAND structure 500 may include a pillar, a wordline (WL) and a bitline (BL). For example, the pillar may include memory cells arranged in a z-direction, the wordline (WL) may include memory cells arranged in a y-direction, and the bitline (BL) may include memory cells arranged in a x-direction.

In an example, a memory cell 501 among the plurality of memory cells may be a target memory cell. The neighboring memory cells may be located adjacent to the memory cell 501. Specifically, the arrows extending from the memory cell 501 in the z-direction indicate neighboring memory cells along the pillar, the arrows extending from the memory cell 501 in the y-direction indicate neighboring memory cells along the WL. Additionally, one or more neighboring memory cells may be disposed adjacent to the memory cell 501 along the BL, that is, in the x-direction.

Figure 6:
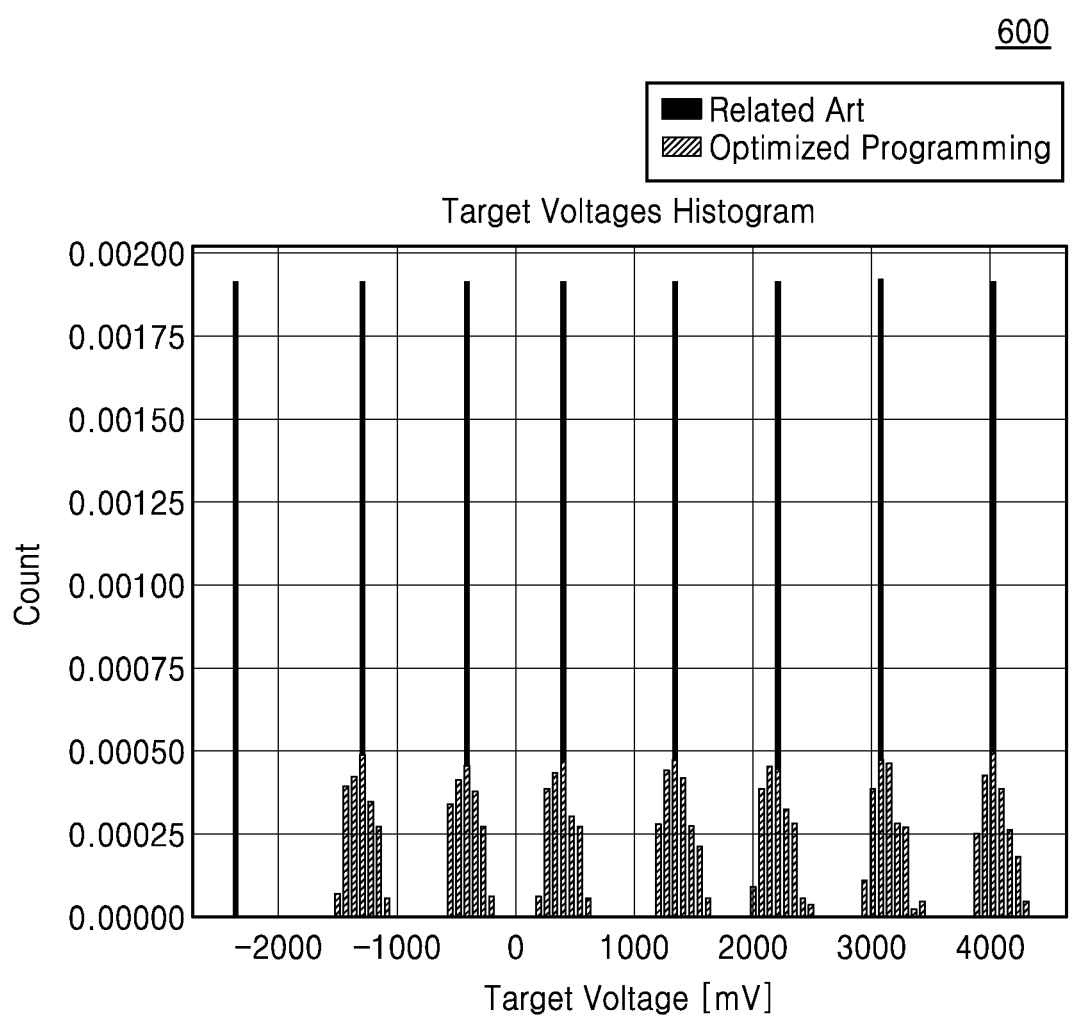
FIG. 6 is a graph illustrating simulation results of target voltages.

FIG. 6 is a graph illustrating simulation results of target voltages of a single triple-level cell (TLC). As noted above, each TLC may store one of eight different symbols, each of which represents three bits.

Referring to FIG. 6, a simulation result 600 using pulse amplitude modulation (PAM) of a single triple-level cell (TLC) is shown.

As shown in FIG. 6, each of the 8 target voltages for a related system are constant. Here, the related pulse programming technique does not consider different characteristics of each of the memory cells. By contrast, target voltages determined according to embodiments of the disclosure vary for each symbol according to the cell features and/or characteristics of the neighboring memory cells.

Figure 7:
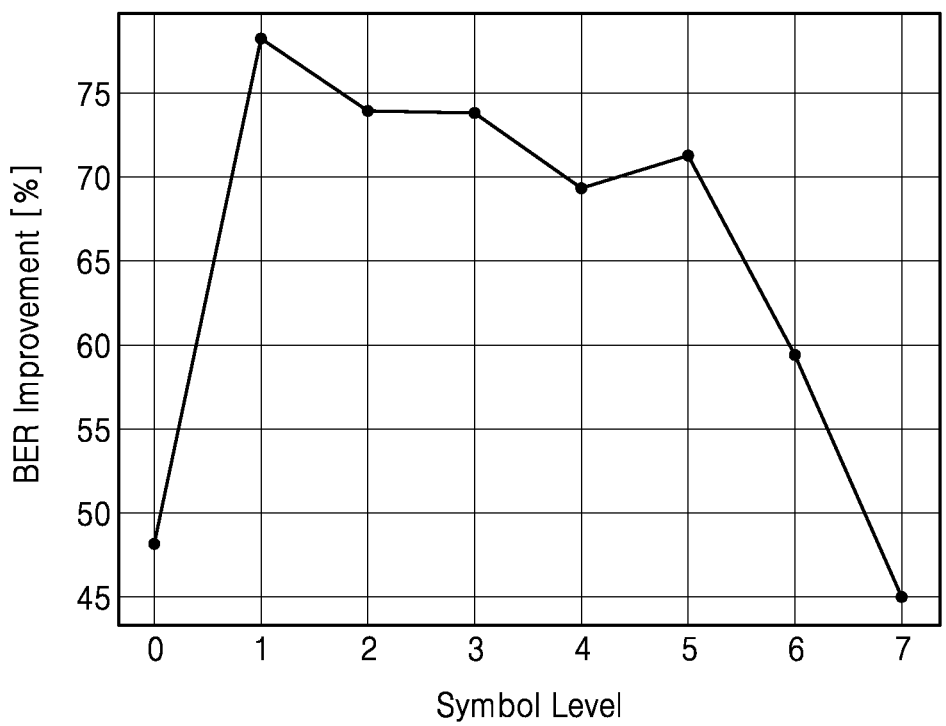
FIG. 7 is a graph illustrating bit error rate (BER) improvement.

FIG. 7 is a graph illustrating bit error rate (BER) improvement of a TLC.

Referring to FIG. 7, a graph 700 illustrates bit error rate (BER) improvement as a measure of performance. The improvement is measured compared to the related modulation system where symbols are mapped to voltage levels using PAM modulation without considering the symbols of the neighboring memory cells. As shown in FIG. 7, the BER improvement is provided for each of the symbols (as the y-axis does not start at 0%), and shows significant improvement over symbol levels 1 to 5 ranging from about 70% to about 78%.

Figure 8:
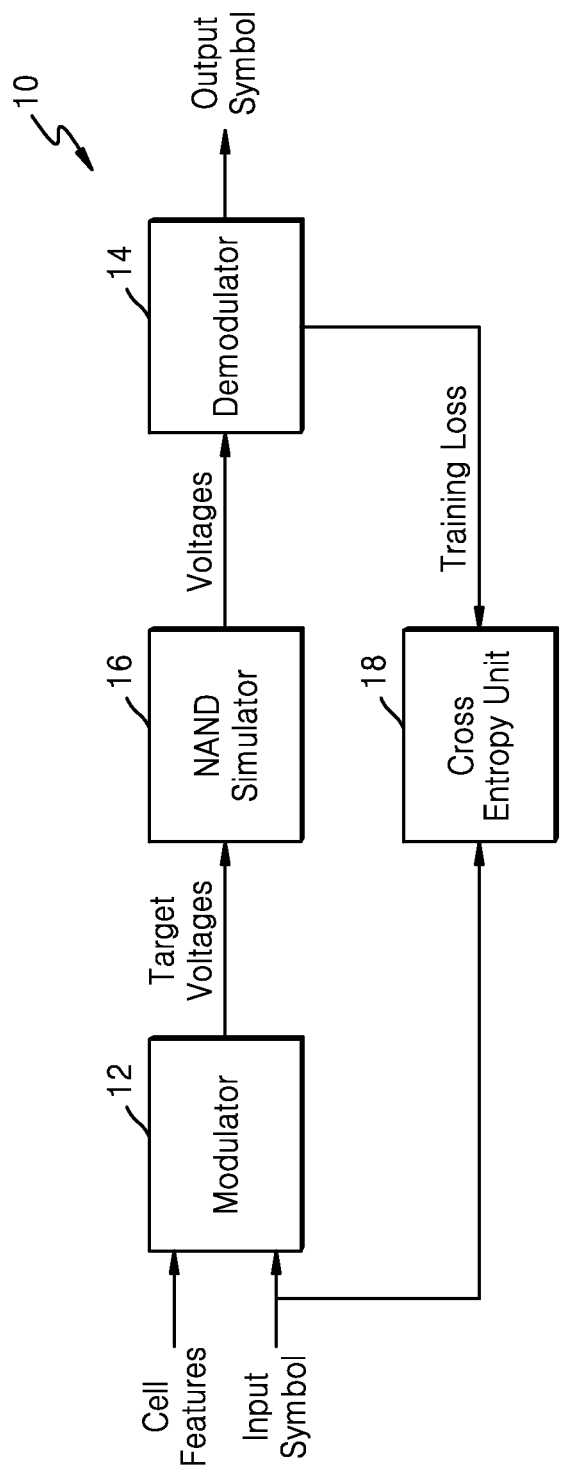
FIG. 8 is a block diagram illustrating training of an auto-modulation apparatus according to embodiments.

FIG. 8 is a block diagram illustrating training of the auto-modulation apparatus for programming target voltages for memory cells according to an embodiment.

Referring to FIG. 8, during training, the auto-modulation apparatus 10 includes the modulator 12, the demodulator 14, a NAND simulator 16, and a cross-entropy unit 18.

As discussed above, the modulator 12 and the demodulator 14 may each include a neural network including a plurality of layers. Each of the neural networks may include, for example, an artificial neural network (ANN) system, a convolutional neural network (CNN) system, a deep neural network (DNN) system, a deep learning system, or the like. Such machine learning systems may include a variety of learning models, such as convolutional neural networks (CNN), deconvolutional neural networks, recurrent neural networks (RNN) including long short-term memory (LSTM) units and/or gated recurrent units (GRU), stacked neural networks (SNN), state-space dynamic neural networks (SSDNN), deep belief networks (DBN), generative adversarial networks (GANs), and/or restricted Boltzmann machines (RBM). Alternatively or additionally, such machine learning systems may include other forms of machine learning models, for example, linear and/or logistic regression, statistical clustering, Bayesian classification, decision trees, dimensionality reduction such as principal component analysis, and expert systems, and/or combinations thereof, including ensemble methods such as random forests.

The NAND simulator 16 may be a derived simulator that simulates the memory cells. For example, the NAND simulator 16 may include a function that simulates the NAND memory cells and calculates derivatives of the function using various automatic differentiation methods. The NAND simulator 16 can perform any function to which standard methods of auto differentiation can be applied. For example, the NAND simulator 16 may be a neural network or other model (for example Gaussian Mixture Model GMM).

The cross-entropy unit 18 may determine a loss function between the input symbols and the output symbols, and train the neural networks of the modulator 12 and the demodulator 14 based on the determined loss function. The training may be performed once during system design for a given NAND version (e.g., sixth-generation V-NAND). The NAND simulator 16 may simulate the memory cell array 223, and its derivative may be calculated using automatic differentiation methods). The neural networks may be trained by standard methods (e.g. stochastic gradient descend (SGD), Adam or any other optimization algorithm). The loss function for the training is the cross entropy (CE) between the input symbols and the recovered symbol probability distribution at the output of the demodulator.

In an embodiment, the modulator 12 may be implemented by a first neural network and parameters of the first neural network may be optimized by training an auto-encoder (AE) system in which the modulator is an encoder. In addition, the demodulator 14 may be implemented by a second neural network and parameters of the second neural network may be trained together with the first neural network of the modulator 12.

Figure 9:
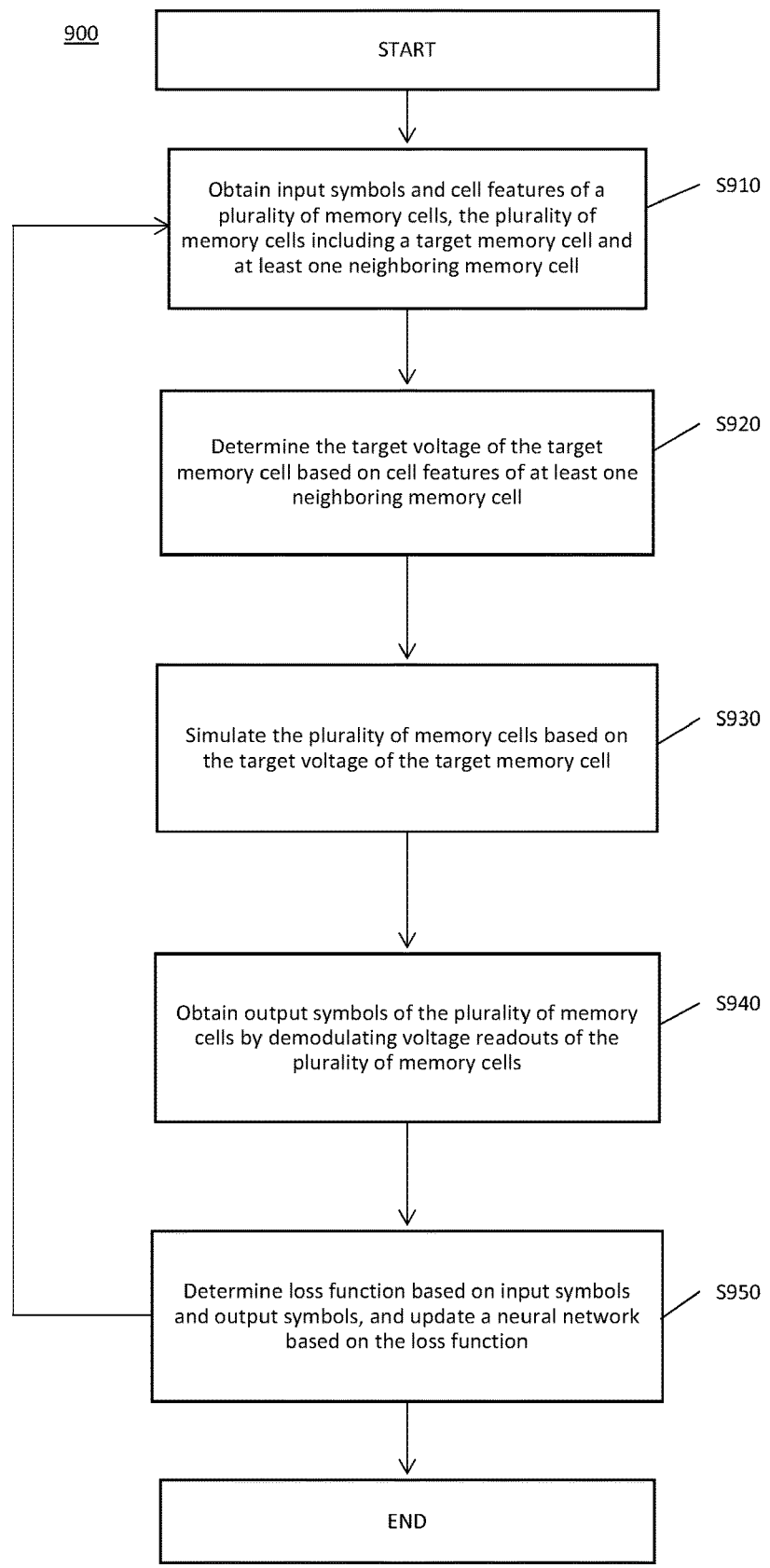
FIG. 9 is a flowchart illustrating a method of training an auto-modulation apparatus according to embodiments.

FIG. 9 is a flowchart illustrating a method of training the neural network 204 and the neural network 208 according to an embodiment.

Referring to FIG. 9, the method 900 may include obtaining input symbols and cell features of a plurality of memory cells, the plurality of memory cells including a target memory cell and at least one neighboring memory cell (S910). An input symbol may include symbols of neighboring memory cells, and the cell feature may include a response time of a memory cell to programming pulses, voltages previously programmed on the one or more memory cells, etc.

The method 900 may include determining a target voltage of the target memory cell based on cell features of the at least one neighboring memory cell (S920). As described above with reference to FIGS. 2 and 3, the modulator 12 may process the obtained input symbols and the cell features through a neural network, and output target voltages for the plurality of memory cells.

The method 900 may include simulating the plurality of memory cells based on the target voltage of the target memory cell (S930). For example, the NAND simulator 16 may simulate the one or more memory cells based on the target voltages determined by the modulator 12. The NAND simulator 16 may include a function that simulates the NAND memory cells and calculates derivatives of the function using various automatic differentiation methods.

The method 900 may include obtaining output symbols of the plurality of memory cells by demodulating voltage readouts of the plurality of memory cells (S940). The demodulator 14 may receive voltage readouts of a target memory cell (and optionally at least one neighboring memory cell) from the NAND simulator 16. The demodulator 14 demodulates the voltage readouts to output a probability distribution of the possible set of symbols. Based on the voltage readout of the target memory cell (and optionally at least one or more of the neighboring memory cells), the demodulator 14 determines the probability distribution of the symbols of the memory cell and outputs the probability distribution or a symbol having a maximum probability.

Furthermore, the method 900 may include determining loss function based on the input symbol and the output symbol, and updating a neural network of the modulator based on the loss function (S950). The method then may be repeated. As described above, the modulator may include a first neural network and the demodulator may include a second neural network. When training the first neural network of the modulator, the second neural network of the demodulator may be trained in tandem with the modulator.

Figure 10:
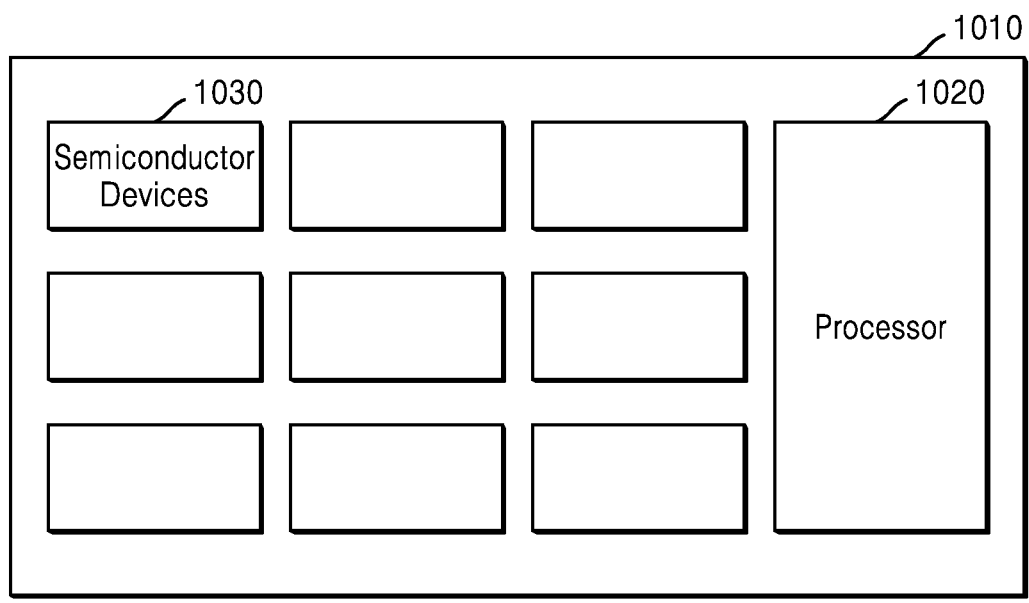
FIG. 10 is a diagram illustrating a schematic plan view of a semiconductor module according to embodiments.

FIG. 10 is a diagram illustrating a schematic plan view of a semiconductor module according to an embodiment.

Referring to FIG. 10, a semiconductor module 1000 according to an embodiment may include a processor 1020 and semiconductor devices 1030 that are mounted on a module substrate 1010. The processor 1020 and/or the semiconductor devices 1030 may include the auto-modulation apparatus 10.

Figure 11:
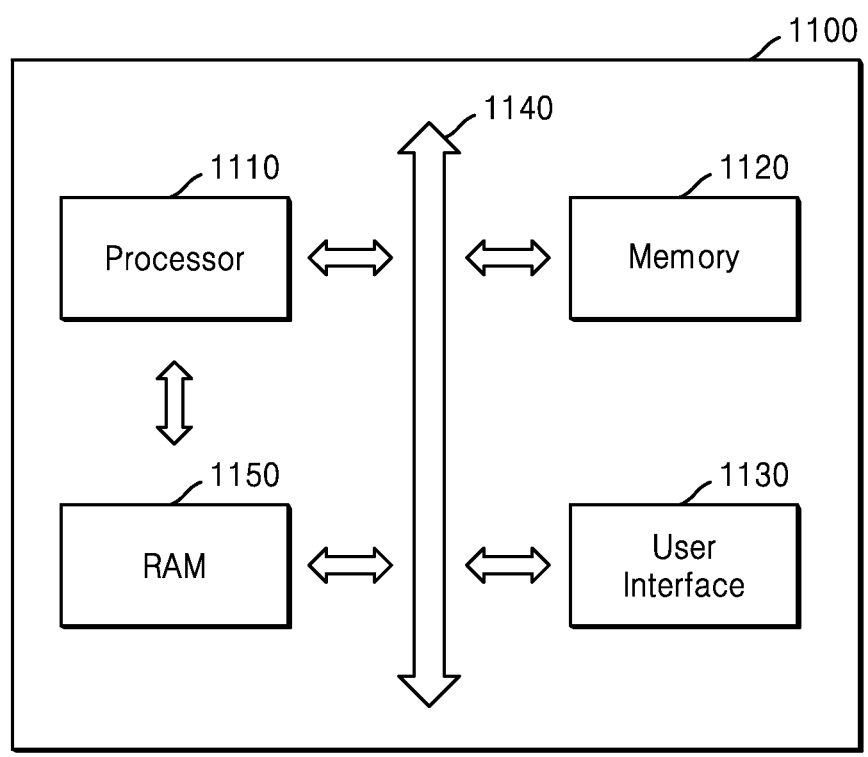
FIG. 11 is a schematic block diagram illustrating an electronic system according to embodiments.

FIG. 11 is a schematic block diagram of an electronic system according to an embodiment.

Referring to FIG. 11, an electronic system 1100 in accordance with an embodiment may include a microprocessor 1110, a memory 1120, and a user interface 1130 that perform data communication using a bus 1140. The microprocessor 1110 may include a central processing unit (CPU) or an application processor (AP). The electronic system 1100 may further include a random access memory (RAM) 1150 in direct communication with the microprocessor 1110. The microprocessor 1110 and/or the RAM 1150 may be implemented in a single module or package. The user interface 1130 may be used to input data to the electronic system 1100, or output data from the electronic system 1100. For example, the user interface 1130 may include a keyboard, a touch pad, a touch screen, a mouse, a scanner, a voice detector, a liquid crystal display (LCD), a micro light-emitting device (LED), an organic light-emitting diode (OLED) device, an active-matrix light-emitting diode (AMOLED) device, a printer, a lighting, or various other input/output devices without limitation. The memory 1120 may store operational codes of the microprocessor 1110, data processed by the microprocessor 1110, or data received from an external device. The memory 1120 may include a memory controller, a hard disk, or a solid state drive (SSD).

Although the auto-modulation apparatus 10 is described as being provided within the controller 222 of the nonvolatile memory 220, embodiments are not limited thereto. For example, any one or any combination of the storage controller 210, the microprocessor 1110, the memory 1120 and/or the RAM 1150 in the electronic system 1100 may include the auto-modulation apparatus 10.

While aspects of embodiments have been particularly shown and described, it will be understood that various changes in form and details may be made therein without departing from the spirit and scope of the following claims.

What is claimed is:
1. An auto-modulation method comprising:
obtaining an input symbol to be stored in a target memory cell among a plurality of memory cells;

obtaining a first neighboring symbol stored in a first neighboring memory cell among the plurality of memory cells that is adjacent the target memory cell;

determining a target voltage for the target memory cell based on the input symbol and the first neighboring symbol; and providing the target voltage to the target memory cell.

2. The auto-modulation method of claim 1, further comprising:

reading the target voltage from the target memory cell; and determining an output symbol based on the target voltage.

3. The auto-modulation method of claim 2, further comprising:

obtaining cell features of the plurality of memory cells; and determining the output symbol based on the target voltage, the first neighboring symbol and the cell features of the plurality of memory cells.

4. The auto-modulation method of claim 3, wherein the determining the target voltage comprises controlling a first neural network to determine the target voltage.

5. The auto-modulation method of claim 4, wherein the determining the output symbol comprises controlling a second neural network to determine the output symbol.

6. The auto-modulation method of claim 5, further comprising:

implementing a simulator configured to simulate the plurality of memory cells;

providing input symbols and the cell features of the plurality of memory cells to the simulator;

obtaining output symbols from the simulator;

determining a loss function based on the input symbols, the cell features of the plurality of memory cells and the output symbols; and updating the first neural network and the second neural network based on the loss function.

7. The auto-modulation method of claim 5, wherein the first neighboring memory cell is directly adjacent the target memory cell.

8. The auto-modulation method of claim 5, wherein the determining the target voltage of the target memory cell comprises:

obtaining a high precision pulse signal of the target voltage from the first neural network; and converting the high precision pulse signal of the target voltage into a discrete signal.

9. The auto-modulation method of claim 5, wherein the cell features of the plurality of memory cells comprise any one or any combination of a response time of a memory cell in response to programming pulses and information about properties of the memory cell.

10. The auto-modulation method of claim 5, wherein the plurality of memory cells are grouped into a plurality of groups, each of which is programmed to a group target voltage assigned to that group.

11. The auto-modulation method of claim 5, wherein the obtaining the output symbol comprises:

receiving a voltage readout of at least one neighboring memory cell adjacent to the target memory cell in the plurality of memory cells;

demodulating the voltage readout and the target voltage read from the target memory cell to obtain a probability distribution over possible symbols; and determining a maximum probability in the probability distribution to obtain the output symbol.

12. The auto-modulation method of claim 5, wherein the plurality of memory cells comprises a first memory cell and a second memory cell, wherein the first memory cell stores a first symbol at a first target voltage, and wherein the second memory cell stores the first symbol at a second target voltage different from the first target voltage.

13. The auto-modulation method of claim 5, wherein the plurality of memory cells comprises a first memory cell and a second memory cell, wherein the first memory cell stores a first symbol at a first target voltage, and wherein the second memory cell stores a second symbol at the first target voltage.

14. A storage device comprising:

a nonvolatile memory; and at least one processor configured to:

obtain an input symbol to be stored in a target memory cell among a plurality of memory cells of the nonvolatile memory;

obtain a first neighboring symbol stored in a first neighboring memory cell among the plurality of memory cells that is adjacent the target memory cell;

determine a target voltage for the target memory cell based on the input symbol and the first neighboring symbol; and provide the target voltage to the target memory cell.

15. The storage device of claim 14, wherein the at least one processor is further configured to:

read the target voltage from the target memory cell; and determine an output symbol based on the target voltage.

16. The storage device of claim 15, wherein the at least one processor is further configured to:

obtain cell features of the plurality of memory cells; and determine the output symbol based on the target voltage, the first neighboring symbol and the cell features of the plurality of memory cells.

17. The storage device of claim 16, wherein the at least one processor is further configured to control a first neural network to determine the target voltage.

18. The storage device of claim 17, wherein the at least one processor is further configured to control a second neural network to determine the output symbol.

19. The storage device of claim 18, further comprising at least one second processor configured to:

provide input symbols and the cell features of the plurality of memory cells to a simulator configured to simulate the plurality of memory cells;

obtain output symbols from the simulator;

determine a loss function based on the input symbols, the cell features of the plurality of memory cells and the output symbols; and update the first neural network and the second neural network based on the loss function.

20. An auto-modulation method comprising:

obtaining an input symbol to be stored in a target memory cell among a plurality of memory cells;

obtaining cell features of the plurality of memory cells;

determining a target voltage for the target memory cell based on the input symbol and the cell features of the plurality of memory cells;

providing the target voltage to the target memory cell;

reading the target voltage from the target memory cell;

determining an output symbol based on the target voltage; and determining the output symbol based on the target voltage and the cell features of the plurality of memory cells, wherein the determining the target voltage comprises controlling a first neural network to determine the target voltage, wherein the determining the output symbol comprises controlling a second neural network to determine the output symbol, wherein the plurality of memory cells are arranged three-dimensionally, wherein the plurality of memory cells comprise a first neighboring memory cell adjacent the target memory cell in a first direction, a second neighboring memory cell adjacent the target memory cell in a second direction, and a third neighboring memory cell adjacent the target memory cell in a third direction, and wherein the first direction, the second direction and the third direction intersect each other.

* * * * *